United States Patent [19]

Sugawara

[11] Patent Number: 5,023,689

[45] Date of Patent: Jun. 11, 1991

[54] COMPLEMENTARY INTEGRATED CIRCUIT DEVICE EQUIPPED WITH LATCH-UP PREVENTING MEANS

[75] Inventor: Yukari Sugawara, Tokyo, Japan

[73] Assignee: NEC Corporation, Japan

[21] Appl. No.: 170,285

[22] Filed: Mar. 18, 1988

[30] Foreign Application Priority Data

Mar. 18, 1987 [JP] Japan .................................. 62-64667

[51] Int. Cl.⁵ .......................................... H01L 27/092
[52] U.S. Cl. .................................... 357/42; 307/296.3;
307/303.1; 307/482.1; 357/45; 357/68;
364/200; 364/232.8
[58] Field of Search ............................ 357/42, 45, 68;
307/303.1, 296.3, 482.1

[56] References Cited

U.S. PATENT DOCUMENTS 3,955,210  5/1976  Bhetia et al. ........................... 357/42
4,656,370  4/1987  Kanuma .................................. 357/68

Primary Examiner—William D. Larkins
Attorney, Agent, or Firm—Laff, Whitesel, Conte & Saret

[57] ABSTRACT

A complementary integrated circuit device is disclosed which includes a semiconductor substrate having a first area in which a plurality of first transistors are formed and a second area in which a plurality of second transistors are formed, each of the first transistors being larger in size than each of the second transistors. A guard ring region is formed in the substrate to surround the first area. The guard ring region is supplied with a power voltage via a first conductor line which is formed separately from a second conductor line supplying the power voltage to each of the first transistors.

8 Claims, 3 Drawing Sheets

COMPLEMENTARY INTEGRATED CIRCUIT DEVICE EQUIPPED WITH LATCH-UP PREVENTING MEANS

BACKGROUND OF THE INVENTION

The present invention relates to a semiconductor integrated circuit device and, more particularly, to a complementary MOS integrated circuit device (called hereinafter "CMOS-IC") including N-channel and P-channel MOS transistors.

As well-known in the art, the CMOS-IC includes a parasitic thyristor therein. When carriers, electrons or holes, are produced in a quantity great enough to trigger the parasitic thyristor, the thyristor is turned ON to cause a so-called latch-up phenomenon which in turn stops the circuit operation of the CMOS-IC and often destroys the IC.

It is also well-known in the art that a noise voltage applied to a lead terminal of a CMOS-IC produces such carriers that trigger the parasitic thyristor. Various countermeasures prevent the latch-up phenomenon caused by the noise voltage (Reference is made to U.S. Pat. No. 3,955,210).

However, the carriers triggering the parasitic thyristor may be produced by not only the noise voltage, but also by the CMOS-IC itself. More specifically, each of the CMOS transistors formed in the CMOS-IC, when subjected to a switching operation produce carriers, which are released into the substrate region surrounding the transistor. If the transistor is of a small size, the amount of the produced carriers is small allowing almost all the carriers to be absorbed by the substrate region. Substantially no carrier is therefore transferred to other features. On the other hand, if the transistor has a large size and, particularly if such transistor is subjected to a switching operation at a high switching rate a great amount of carriers are produced, a part of a which is released to the substrate to be transferred as excess carriers to other transitors surrounding the carrier-producing transistor. As a result, the parasitic thyristor is turned ON to cause the latch-up phenomenon.

This presents a serious problem in a one-chip semiconductor substrate together with the CPU, ROM, and RAM areas. A clock pulse generating area consists of a large number of large-sized CMOS transistors operating at a high switching rate. This is because the carriers, generated at such a large-sized CMOS transistors in the clock pulse generating area, are released as excess carriers into the CPU, ROM and RAM areas, adversely affecting their functions.

SUMMARY OF THE INVENTION

Therefore, an object of the present invention is to provide a CMOS-IC in which carriers produced by transistors do not cause the latch-up phenomenon.

Another object of the present invention is to provide a CMOS-IC having means for preventing carriers produced by transistors from causing the latch-up phenonmenon.

Still another object of the present invention is to provide a single chip microprocessor free from the latch up phenomenon, which may otherwise be caused by the excess carriers released from the clock pulse generating area of the microprocessor into the CPU, ROM and/or RAM areas, formed in a monolithic semiconductor substrate together with the clock pulse generating region.

A CMOS-IC according to the present invention comprises a semiconductor substrate having a first area in which a plurality of first transistors are formed and a second area in which a plurality of second transistors are formed, each of the of the second transistors being larger in size than each first transistors and being capable of allowing a great number of carriers to be released into the semiconductor substrate, a guard ring region formed in the semiconductor substrate to surround the second area, a first interconnection line formed on the semiconductor substrate and supplying a power voltage to each of the second transistors, and a second interconnection line formed on the semiconductor substrate independently of the second interconnection line and supplying the power voltage to the guard ring region.

Each of the second transistors formed in a larger size and therefore produces a large amount of carriers in response to a switching operation thereof. A part of the produced carriers is apt by a substrate region of the second transistor, but the remaining carriers are intended to be transferred to other second transistors and/or to the first area. However, the guard ring region is formed to surround the second area. Moreover, the guard ring region is supplied with the power voltage via the second interconnection line formed independently of the first interconnection line, and therefore the voltage of the guard ring region is constant irrespective of a voltage change of the first interconnection line caused by a variation of a current flowing therethrough. Accordingly, the remaining carriers are absorbed into the guard ring region, so that substantially no excess carrier is transferred not only the first area but to other transistor in the second area.

BRIEF DESCRIPTION OF THE DRAWINGS

The above and other objects, advantages and features of the present invention will be more apparent from the following description taken in conjunction with the accompanying drawing, in which.

DETAILED DESCRIPTION OF THE PREFERRED EMBODIMENT

Figure 1:
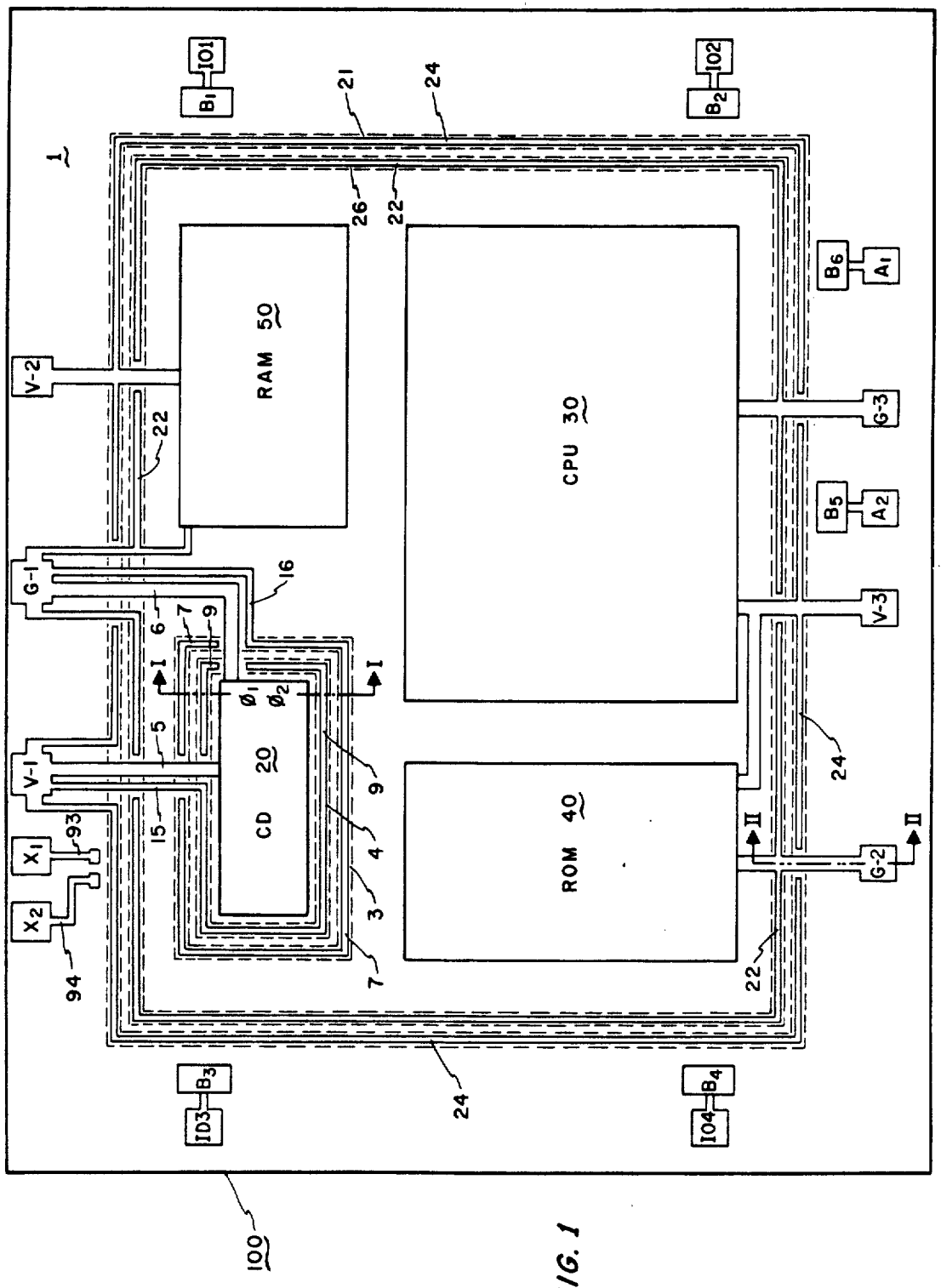
FIG. 1 is a plan view representative of one chip microprocessor according to an embodiment of the present invention in which both the first level and second level conductor layers are shown.

Referring to FIG. 1, a CMOS-IC chip 100 according to an embodiment of the present invention is a microprocessor which includes a clock generator/driver (CD) 20, a central processing unit (CPU) 30, a read only memory (ROM) 40 and an random access memory (RAM) 50, all formed in a single semiconductor substrate 1 of one conductivity type (P-type in this embodiment). The CPU 30, ROM 40 and RAM 50 are interconnected by address/data bus lines (not shown). Each of the blocks 20 to 50 includes a great number of N-channel and P-channel MOS transistors which are interconnected to constiute necessary circuits.

The CD 20 includes an oscillation circuit having a quartz crystal (not shown) to be externally connected between terminals $X_1$ and $X_2$ and generates two system clocks $\phi_1$ and $\phi_2$ having predetermined pulse frequencies. The terminals $X_1$ and $X_2$ are connected to the CD 20 via second-level interconnection lines 93 and 94 and first-level interconnection lines 13 and 14 shown in FIG. 2, respectively. A first power voltage of +5 V is supplied to a first power terminal V-1 and a second ground terminal G-1. The first power voltage is also supplied to second and third power terminals V-2 and V-3 and the second power voltage is also supplied to second and third ground terminals G-2 and G-3. The first power terminal V-1 is connected to CD 20 via a second-level interconnection line 5 to supply the first power voltage to each transistor in the CD 20. The first ground terminal G-1 is also connected to the CD 20 via a second-level interconnection line 6 to supply the ground potential thereto. The system clocks $\phi_1$ and $\phi_2$ are supplied to the CPU 30 via first-level interconnection lines 11 and 12 shown in FIG. 2, respectively. The CPU 30 executes a program stored in the ROM 40 in response to the system clocks $\phi_1$ and $\phi_2$. The ROM 40 often stores fixed data in addition to the program. The RAM 50 stores data to be processed by the CPU 70 and processed results from the CPU 3.

The CD 20 is required to operate at a very high frequency, generate the system clocks $\phi_1$ and $\phi_2$ of a predetermined rate and supply them to the CPU with sufficient driving capability. For this purpose, each of the MOS transistors in the CD 20 is formed in a very large size (several hundred times larger than each MOS transistor in the CPU 30, ROM 40 and RAM 50) to give a large current capacity. Therefore, each MOS transistor in the CD 20 produces, when subjected to a switching operation a great amount of carriers which are released to the section of the substrate constituting the CD 20. That substrate section represents a part of the silicon substrate 1 in which N-channel MOS transistors are formed with N-well regions in each of which a P-channel MOS transistor is formed. The amount of carriers produced in the CD 20 is so large that, a part of them cannot be absorbed in the MOS transistors formed in the CD 20 allowing a part of them to be released as excess carriers to CPU 30, ROM 40 and RAM 50 (In this connection, measures for preventing the latch-up caused by the charge transfer between each P-channel and N-channel MOS transistor pair formed in the CD 20, may be taken according to the teaching of the above referenced U.S. Pat. No. 3,955,210). As a result, the latch-up phenomenon occurs to the break down the function of the microcomputer chip 100.

Figure 2:
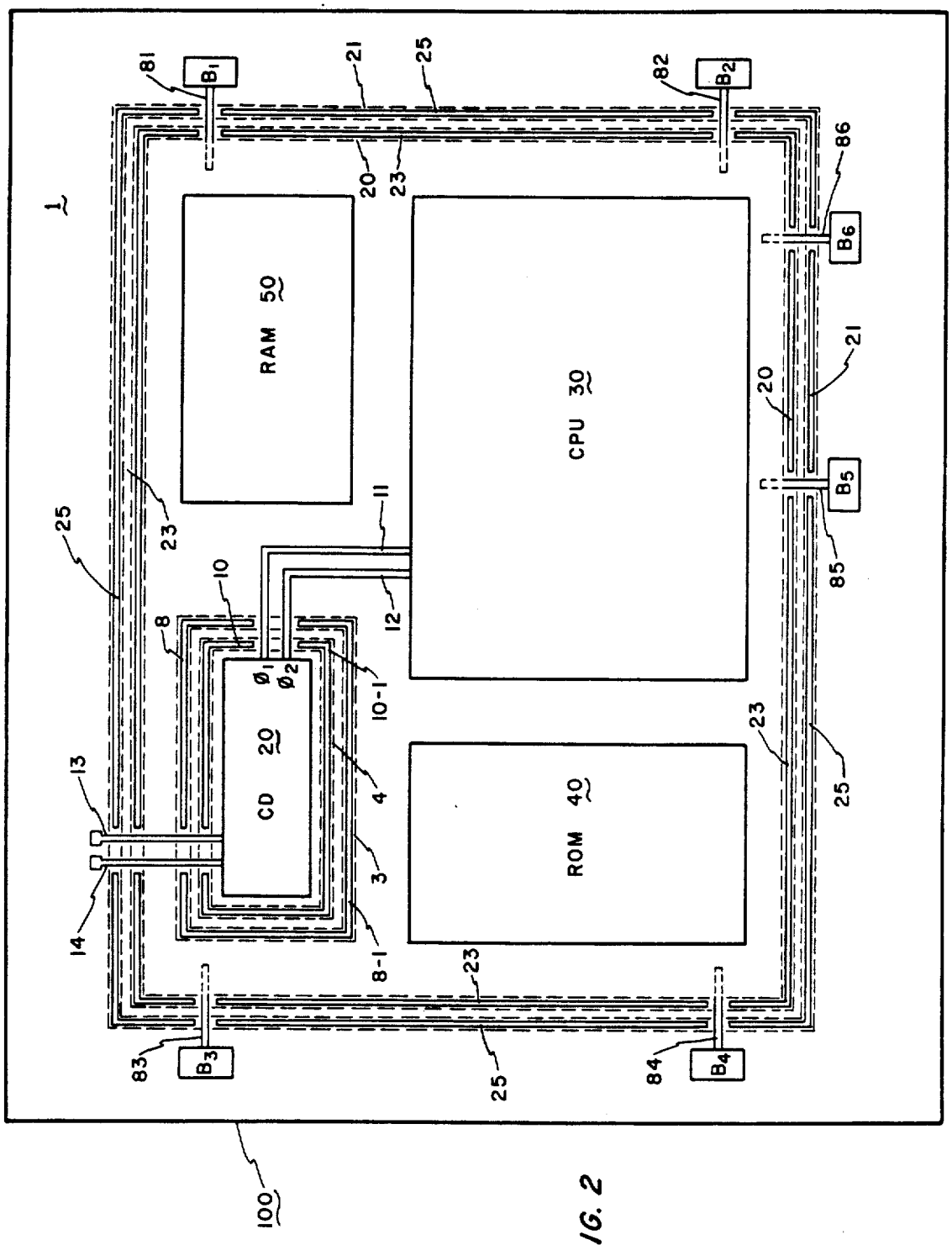
FIG. 2 is a plan view representative of the same microprocessor in which only the first-level conductor layer is shown.
Figure 3:
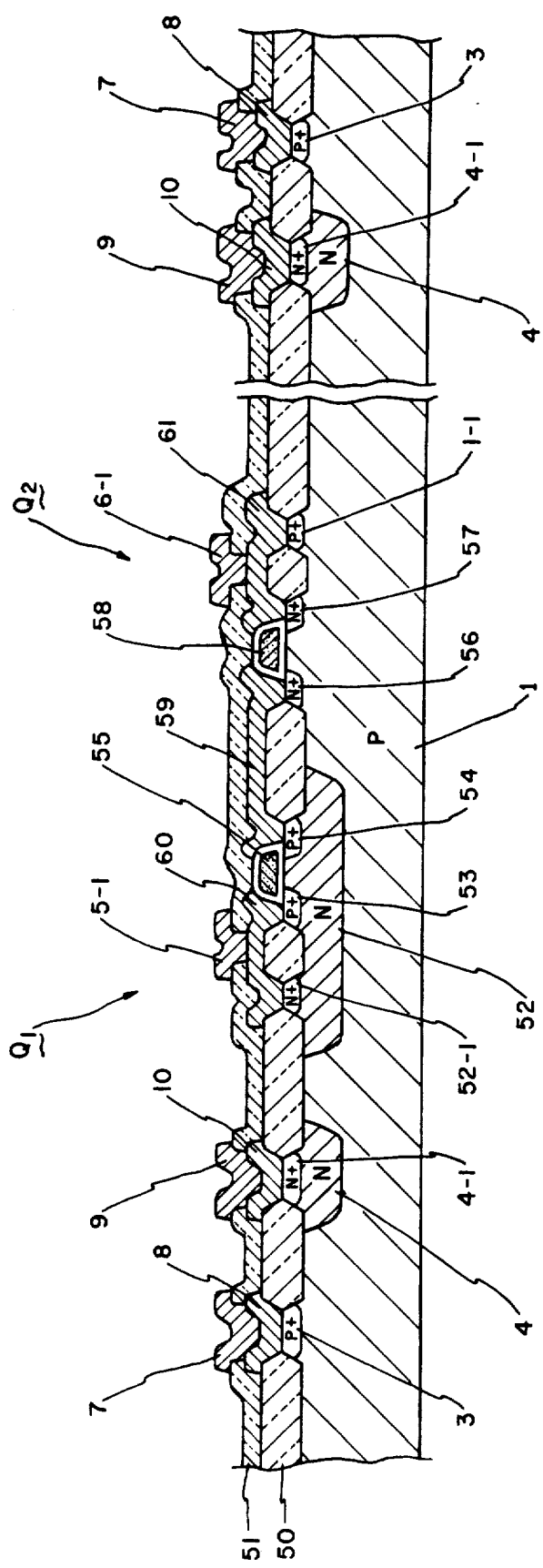
FIG. 3 is a cross sectional view along a line I—I shown in FIG. 1.

In order to solve this problem, guard ring regions 3 and 4 are formed in the substrate 1 in accordance with the present invention. The guard ring region 3 is of the P-type and the guard ring region 4 is of the N-type and they completely surround the CD 20. In this embodiment, the P-type guard ring region 3 is formed outside the N-type guard ring region, but can be formed inside it, if desired. Referring to FIG. 2, first-level aluminum layers 8, which are provided simultaneously with other first-level interconnection lines, are provided on the p-type guard ring region 3 except on portions thereof over which the first-level interconnection lines 11 to 14 cross via an insulation film, respectively. Similarly, first-level aluminum layers 10 are formed on the N-type gurad ring region 4 except on portions thereof over which the interconnection lines 11 to 14 cross via an insulation film, respectively. Turning back to FIG. 1, second-level aluminum layers 7 and 9, which are formed simultaneously with other second-level interconnection lines, are provided directly on the layers 8 and 10, respectively, except on portions thereof over which the interconnection lines 5 and 6 cross via an insulation film. The second-level layers 7 and 9 are also provided above the first-level interconnection lines 11, 12, 13 and 14 to bridge the lacked portions 8 and 10. The guard ring regions 3 and 4 and the aluminum layers 7 to 10 are shown in more detail in FIG. 3 which is cross sectional view along a line I—I in FIG. 1. FIG. 3 also shows one P-channel MOS transistor $Q_1$ and one N-channel MOS transistor $Q_2$ in the CD 2. The N-type guard ring region 4 is formed simulataneously with an N-well region 52 operating as the substrate region of the transistor $Q_1$, and the P-type guard ring region 3 is formed simultaneously with source and drain regions 53 and 54 of the transistor $Q_1$. The N-type guard ring region 4 has a contact region 4-1 which is formed simultaneously with source and drain regions 56 and 57 of the transistor $Q_2$. The transistors $Q_1$ and $Q_2$ have gates 55 and 58 made of polycrsstalline silicon. The N-well region 52 has a contact region 52-1 which is in turn connected to the source region 53 by a first-level interconnection line 60. A contact region 1-1 is formed near the transistor $Q_2$ and connected to the source region 57 thereof via a first-level interconnection line 61. The drain regions 54 and 56 of the transistors $Q_1$ and $Q_2$ are connected to each other by a first-level interconnection line 59 which is in turn led out to another transistor. A second-level interconnection line 5-1 connects the line 60 to the line 5 (FIG. 1) to supply the power voltage thereto. The line 61 is connected via a second-level interconnection line 6-1 to the line 6 (FIG. 1) to receive the ground potential. Silicon oxide layers 50 embedded in part in the substrate 1 are formed selectively to isolate the respective regions and transistors, and an insulating layer 51 separates the first-level interconnection lines from the second-level interconnection lines.

Turning back to FIG. 1, the aluminum layer 7 is connected via a second-level interconnection line 16 to the first ground terminal G-1, and the aluminum layer 9 is connected to the first power terminal V-1 via a second-level interconnection line 15. Therefore, the P-type guard ring region 3 is supplied with the ground voltage and the N-type guard ring region 4 receives the power voltage. Moreover, the interconnection lines 15 and 16 are formed independently of and separately from the lines 5 and 6. The transistors in the CD 20 carry out a switching operation at a high speed to generate the system clocks $\phi_1$ and $\phi_2$, and further currents flowing therethrough are considerably large as mentioned above. For this reason, the potentials on lines 5 and 6 vary due to impedance and/or inductance thereof. If the layers 7 and 9 are respectively connected to the lines 5 and 6, therefore, the voltages of the guard ring regions 3 and 4 are not stabilized, but changed. Since the interconnection lines 15 and 16 are formed independently, however, the voltages of the guard ring regions 3 and 4 are not changed and they are constant. In addition, the first-level aluminum layers 8 and 10 are directly connected to the guard ring regions 3 and 4, respectively, along almost entire lengths thereof to decrease the resistances of the regions 3 and 4. Therefore, the voltage drops along the lengths of guard ring regions 3 and 4 are suppressed.

As discussed hereinbefore, since the transistors in the CD 20 are formed in a large size, the source and drain regions 53, 54, 56 and 57 of the transistors $Q_1$ and $Q_2$ shown in FIG. 3 have a large area. For this reason, a great amount of carriers are produced by the switching operations of the transistors $Q_1$ and $Q_2$ and then supplied to the substrate regions thereof. Since the contact regions 52-1 and 1-1 are respectively formed near the transistors $Q_1$ and $Q_2$, they have a function of absorbing the carriers therefrom. However, the amount of the produced carriers is very large and the voltage of the contact regions 52-1 and 1-1 change, so that all carriers are not absorbed. Thus, the rest of carriers from the transistors $Q_1$ and $Q_2$ are released beyond these transistor $Q_1$ and $Q_2$ and tend to be transferred to other transistors in the CD 20 and to the formation areas of the CPU 30, ROM 40 and RAM 50. However, the guard ring regions 3 and 4 are formed to surround the CD 20 and a constant voltage is supplied to the regions 3 and 4. Accordingly, the guard ring regions absorb undesired carriers which would otherwise move into the substrate 1. Thus, the occurrence of the latch-up phenomenon caused by the carriers from the transistors in the CD 20 is prevented.

Figure 4:
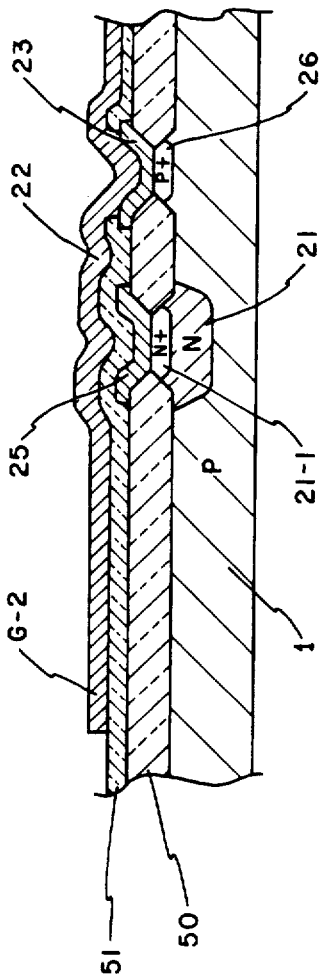
FIG. 4 is a cross sectional view along a line II—II shown in FIG. 1.

The microprocessor chip 100 shown in FIG. 1 further has a P-type guard ring region 26 and an N-type guard ring region 21 which are formed along the periphery of the chip 100 to completely surround the CD 20, CPU 30, ROM 40 and RAM 50. The microprocessor chip 100 is equipped with a plurality of input/output terminals to receive data to be processed and to output processed data. In FIG. 1, only four input/output terminals IO1 to IO4 are shown. In addition, a plurality of address output terminals are provided (two terminals $A_1$ and $A_2$ are shown in FIG. 1). These terminals IO1 to IO4, $A_1$ and $A_2$ are associated buffer circuits $B_1$ to $B_6$, respectively. Since a load capacitance of each of the terminals IO1 to IO4, $A_1$ and $A_2$ is considerably large, each of the buffer circuits $B_1$ to $B_6$ is designed to have large driving ability. That is, large-sized transistors are employed in each buffer circuit B. Therefore, the buffer circuits $B_1$ to $B_6$ may supply the CD 20, CPU 30, ROM 40, RAM 50 with carriers causing the latch-up phenomenon. In order to absorb such carriers, the guard ring regions 26 and 21 surround the internal circuit blocks 20 to 50 and intervene between each circuit block and each buffer circuit B. As shown in FIGS. 2 and 4, first-level aluminum layers 23 and 25 are respectively formed on the guard ring resions 26 and 21 except on portions thereof over which first-level interconnection lines 81 to 83 of the buffer circuits B1 to B6 and the first-level interconnection lines 13 and 14 cross via an insulation film, respectively. The guard ring region 21 has a contact region 21-1. Referring also to FIG. 1, a second-level aluminum layer 22 connected to the ground terminals G-1 to G-3 is formed on the layer 23 except on portions thereof over which the second-level interconnection lines connected to the power terminals V-1 to V-3 cross via the insulation film 51. A second-level aluminum layer 24 connected to the power terminals V-1 to V-3 is formed on the layer 25 except on portions thereof over which the second-level interconnection lines connected to the ground terminals G-1 to G-3 cross via the insulation film 51. Therefore, the P-type guard ring region 26 is supplied with the ground voltage and the N-type guard ring region 21 is supplied with the power voltage. Thus, the carriers from the buffer circuits B1 to B6 are absorbed by the guard ring regions 26 and 21 and are not transferred to the internal blocks 20, 30, 40 and 50.

The present invention is not limited to the above embodiment, but may be changed and modified without departing from the scope and spirit of the invention.

What is claimed is:

1. A complementary semiconductor device comprising a semicondutor substrate having a first area in which a plurality of first transistors are formed and a second area in which a plurality of second transistors are formed, said first transistors being larger in size than second transistors, to produce carriers moving in said semiconductor substrate when said first transistors are in operation, a guard ring region formed along a periphery of said first area in said semiconductor substrate and surrounding said first area, a first interconnection line formed on said substrate and supplying a power voltage to transistors in said first area, a conductor layer formed on a surface of said guard ring region and along said guard ring region to be in contact with substantially the entire surface of said guard ring region, and a second interconnection line formed on said semiconductor substrate separately from said first interconnection line for supplying said power voltage via said conductor layer to said guard ring region independently of said first interconnection line, whereby the voltage of said guard ring region is substantially equalized over its entire length irrespective of an internal resistance of said guard ring region and stabilized irrespective of a change in voltage of said first interconnection line caused by the operation of said first transistors so that said guard ring region absorbs said carriers to prevent said carriers from being substantially transferred from said first area to said second area.

2. A semiconductor device comprising a semiconductor substrate of one conductivity type, first and second circuit blocks formed in said semiconductor substrate, each of said first and second circuit blocks including a plurality of N-channel and P-channel transistors, transistors in said first circuit block being larger in size than transistors in said second circuit block and performing a switching operation to produce carriers flowing through said semiconductor substrate, a first guard ring region of an opposite conductivity type formed in said semiconductor substrate along a periphery of said first circuit block and surrounding said first circuit block, a second guard ring region of said one conductivity type formed in said semiconductor substrate along a periphery of said first circuit block and surrounding said first block in parallel to said first guard region, first and second power terminals, a first conductive layer formed on a surface of said first guard ring region and along said first guard ring region to be in contact with substantially the entire surface of said first guard ring region, a second conductive layer formed on a surface of said second guard ring region and along said second guard ring region to be in contact with substantially the entire surface of said second guard ring region, a first conductor line connecting said first power terminal to said first circuit block to apply a first power voltage to the transistors in said first circuit block, a second conductor line connecting said second power terminal to said first circuit block to apply a second power voltage to the transistors in said first circuit block, a third conductor line formed separately from said first conductor line and connecting said first power terminal to said first conductive layer to apply said first power voltage to said first guard ring region independently of said first conductor line, and a fourth conductor line formed separately from said second conductor line and connecting said second power terminal to said second conductive layer to apply said second power voltage to said second guard ring region independently of said second conductor line, whereby the voltages of said first and second guard ring regions are stabilized irrespective of a change in voltage of said first and second conductor lines due to the switching operation of the transistors in said first circuit block and said first and second guard ring regions prevent said carriers from substantially reaching said second circuit block through said semiconductor substrate.

3. The device as claimed in claim 2, further comprising at least one input/output buffer circuit having at least one transistor performing a switching operation, a third guard ring region of said opposite conductivity type formed in said semiconductor substrate and surrounding said first and second circuit blocks, said third guard ring region intervening between said at least one buffer circuit and said first and second circuit blocks, and a fifth conductor line connecting said first power terminal to said third guard ring region whereby said third guard ring region absorbs carriers produced by the switching operation of said at least one buffer circuit to prevent the carriers from being transferred to said first and second circuit blocks.

4. A complementary semiconductor device comprising a semiconductor substrate of one conductivity type, a clock generator formed in said semiconductor substrate and including a plurality of transistors, a central processing unit formed in said semiconductor substrate and including a plurality of transistors, a memory formed in said semiconductor substrate and including a plurality of transistors, a first guard ring region of said one conductivity type formed in said semiconductor substrate along a periphery of said clock generator and surrounding said clock generator, a second guard ring region of an opposite conductivity type formed in said semiconductor substrate along the periphery of said clock generator and surrounding said clock generator in parallel to said first guard ring region, first and second power terminals, a first conductor formed on a surface of said first guard ring region along said first guard ring region to be in contact with substantially the entire surface of said first guard ring region, a second conductor formed on a surface of said second guard ring region along said second guard ring region to be in contact with substantially the entire surface of said second guard ring region, a third conductor connecting said first conductor to said first power terminal, and a fourth conductor connecting said second conductor to said second power terminal, whereby a voltage of said first guard ring region is substantially equalized over its entire length irrespective of an internal resistance of said first guard ring region and a voltage of said second guard ring region is substantially equalized over its entire length irrespective of an internal resistance of said second guard ring so that carriers produced by said clock generator are absorbed by said first and second guard ring regions without substantially reaching said central processing unit and said memory.

5. The device as claimed in claim 4, further comprising a third guard ring region of said one conductivity type formed in said semiconductor substrate along a periphery of said semiconductor substrate and surrounding said clock generator, said central processing unit and said memory, a fourth guard ring region of said opposite conductivity type formed in said semiconductor substrate along the periphery of said semiconductor substrate and surrounding said clock generator, said central processing unit and said memory in parallel with said third guard ring region, a third conductor connecting said first power terminal to said third guard ring region, and a fourth conductor connecting said second power terminal to said fourth guard ring region.

6. A complementary MOS-based one-chip microprocessor comprising; a semiconductor substrate of one conductivity type;
   a clock pulse generator having a plurality of first complementary MOS transistors formed in a first section of said semiconductor substrate, said first transistors having a tendency to produce excess carriers when subjected to a switching operation of a high repetition rate in order to provide clock pulses;
   a central processing unit having a plurality of second complementary MOS transistors formed in a second section of said semiconductor substrate;
   a memory having a plurality of third complementary MOS transistors formed in a third section of said semiconductor substrate;
   a first guard ring region of said one conductivity type formed in said semiconductor substrate surrounding said first section;
   a second guard ring region of the opposite conductivity type formed in said semiconductor substrate surrounding said first section adjacent to said first guard ring substantially over its entire length;
   a first and a second terminal means formed on the surface of said semiconductor substrate for making an external connection to a first and a second potential source respectively, said first and second terminal means being connected to said clock pulse generator, said central processor unit and said memory respectively through first and second wiring means;
   a first conductive means separate from said first and second wiring means for connecting said first guard ring region to said first terminal means, said first conductive means comprising a conductive film formed on said first guard ring region and over substantially its entire length; and
   a second conductive means separate from said first and second wiring means for connecting said second guard ring region to said second terminal means, said second conductive means comprising a conductive film formed on said second guard ring region over substantially its entire length;
   whereby said excess carriers are prevented from being transferred to said second or third sections by said guard ring regions, thereby preventing the latch-up of said second and third MOS transistors.

7. A complementary MOS-based one-chip microprocessor as claimed in claim 6 further comprising;
   a plurality of buffer circuits each having a plurality of complementary MOS transistors formed in a fourth section of said semiconductor substrate, said fourth MOS transistors having a tendency to produce excess carriers when subjected to switching operation at a high repetition rate;
   a third guard ring region of said one conductivity type formed in said semiconductor substrate surrounding said first, second and third sections;
   a fourth guard ring region of said opposite conductivity type formed in said semiconductor substrate surrounding said first, second and third sections adjacent to said third guard ring region over substantially its entire length;

signal input/output terminals formed on said semiconductor substrate connected respectively to said buffer circuits for external connection; and conductive means for connecting said third and fourth guard ring regions respectively to said first and second terminal means; whereby said excess carriers from said fourth MOS transistors are prevented from being transferred to said second and third sections thereby to prevent the latch-up of said second and third MOS transistors.

8. A complementary MOS-based one-chip microprocessor a semiconductor substrate of one conductivity type;

- a clock pulse generator having a plurality of first complementary MOS transistors formed in a first section of said semiconductor substrate, said first transistors having a tendency to produce excess carriers when subjected to a switching operation of a high repetition rate in order to provide clock pulses;
- a central processing unit having a plurality of second complementary MOS transistors formed in a second section of said semiconductor substrate;
- a memory having a plurality of third complementary MOS transistors formed in a third section of said semiconductor substrate;
- a first guard ring region of said one conductivity type formed in said semiconductor substrate surrounding said first section;
- a second guard ring region of the opposite conductivity type formed in said semiconductor substrate surrounding said first section adjacent to said first guard ring substantially over its entire length;
- a first and a second terminal means formed on the surface of said semiconductor substrate for making an external connection to a first and a second potential source respectively, said first and second terminal means being connected to said clock pulse generator, said central processor unit and said memory respectively through first and second wiring means;
- a first conductive means separate from said first and second wiring means for connecting said first guard ring region to said first terminal means; and
- a second conductive means separate from said first and second wiring means for connecting said second guard ring region to said second terminal means;

whereby said excess carriers are prevented from being transferred to said second or third sections by said guard ring regions, thereby preventing the latch-up of said second and third MOS transistors;

a plurality of buffer circuits each having a plurality of complementary MOS transistors formed in a fourth section of said semiconductor substrate, said fourth MOS transistors having a tendency to produce excess carriers when subjected to switching operation at a high repetition rate;

a third guard ring region of said one conductivity type formed in said semiconductor substrate surrounding said first, second and third sections;

a fourth guard ring region of said opposite conductivity type formed in said semiconductor substrate surrounding said first, second and third sections adjacent to said third guard ring region over substantially its entire length;

signal input/output terminals formed on said semiconductor substrate connected respectively to said buffer circuits for external connection; and conductive means for connecting said third and fourth guard ring regions respectively to said first and second terminal means;

whereby said excess carriers from said fourth MOS transistors are prevented from being transferred to said second and third sections thereby to prevent the latch-up of said second and third MOS transistors;

said conductive means comprise conductive films formed respectively on said third and fourth guard ring regions over substantially their entire lengths.

* * * * *